(12) United States Patent
Yang

(10) Patent No.: US 7,753,110 B2
(45) Date of Patent: Jul. 13, 2010

(54) HEAT DISSIPATION DEVICE

(75) Inventor: Jian Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 260 days.

(21) Appl. No.: 11/953,716

(22) Filed: Dec. 10, 2007

(65) Prior Publication Data
US 2009/0145582 A1 Jun. 11, 2009

(51) Int. Cl.
*H05K 7/20* (2006.01)
(52) U.S. Cl. .................... 165/104.33; 361/700
(58) Field of Classification Search ............ 165/104.33; 361/700; 257/715
See application file for complete search history.

(56) References Cited

U.S. PATENT DOCUMENTS 6,796,373 B1 *  9/2004  Li ......................... 165/104.33
6,961,243 B2 * 11/2005  Shih-Tsung ................. 361/700
7,636,240 B2 * 12/2009  Kim ........................... 361/700
2004/0226697 A1 * 11/2004  Liu ........................ 165/104.33
2005/0126762 A1 *  6/2005  Lin ........................ 165/104.33
2005/0183849 A1 *  8/2005  Ko et al. ................ 165/104.33
2006/0011329 A1 *  1/2006  Wang et al. ............ 165/104.33
2006/0032616 A1 *  2/2006  Yang ..................... 165/104.33
2006/0245162 A1 * 11/2006  Lee et al. .................... 361/701

* cited by examiner

*Primary Examiner*—Leonard R Leo
(74) *Attorney, Agent, or Firm*—Jeffrey T. Knapp

(57) ABSTRACT

A heat dissipation device includes a base adapted for absorbing heat from an electronic device, a heat spreader located above the base, a first fin assembly including a plurality of fins arranged between the base and the heat spreader, and a heat pipe thermally contacting with the base and the heat spreader. A channel is defined between every two adjacent fins. Each of the fins extends along a front-to-rear direction. The heat pipe includes an evaporating portion thermally contacting with the base, a condensing portion thermally contacting with the heat spreader, and a connecting portion interconnecting the evaporating portion and the condensing portion. The evaporating portion and condensing portion of the heat pipe are parallel to the fins, and the connecting portion of the heat pipe is located at a rear side of the first fin assembly.

9 Claims, 3 Drawing Sheets

HEAT DISSIPATION DEVICE

BACKGROUND OF THE INVENTION

1. Field of the Invention

The present invention relates to a heat dissipation device adapted for removing heat from electronic devices, and more particularly to a heat dissipation device incorporating heat pipes for improving heat dissipation efficiency of the heat dissipation device.

2. Description of Related Art

During operation of an electronic device such as computer central processing units (CPUs), a large amount of heat is often produced. The heat must be quickly removed from the CPU to prevent it from becoming unstable or being damaged. Typically, a heat dissipation device is attached to an outer surface of the CPU to absorb heat from the CPU. The heat absorbed by the heat dissipation device is then dissipated to ambient air.

Conventionally, a heat dissipation device may incorporate a plurality of heat pipes. The heat dissipation device further comprises a base for contacting an electronic device and a plurality of fins arranged on the base. A channel is defined between every two adjacent fins for allowing airflow to flow therethrough. The base defines a plurality of grooves therein. The fins cooperatively define a plurality of through holes therein. Each heat pipe has a substantially straight evaporating portion received in a corresponding groove of the base, and a straight condensing portion received in a corresponding through hole of the fins, which extending through the channels transversely from a lateral side of the fins. The heat generated by the electronic device is absorbed by the base, and transferred from the base to the fins via the heat pipes, and finally dissipated from the fins to ambient air. However, the condensing portions of the heat pipes extending through the channels causes the increasing of the resistance of airflow to flow through the channels, which accordingly reduces the heat dissipating efficiency of the heat dissipation device.

What is needed, therefore, is an improved heat dissipation device which can overcome the above problems.

SUMMARY OF THE INVENTION

A heat dissipation device includes a base adapted for absorbing heat from an electronic device, a heat spreader located above the base, a first fin assembly including a plurality of fins arranged between the base and the heat spreader, and a heat pipe thermally contacting the base and the heat spreader. A channel is defined between every two adjacent fins. Each of the fins extends along a front-to-rear direction, and the channel extends along the front-to-rear direction. The heat pipe includes an evaporating portion thermally contacting the base, a condensing portion thermally contacting the heat spreader, and a connecting portion interconnecting the evaporating portion and the condensing portion. The evaporating portion and condensing portion of the heat pipe are parallel to the fins, and the connecting portion of the heat pipe is located at a rear side of the first fin assembly.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
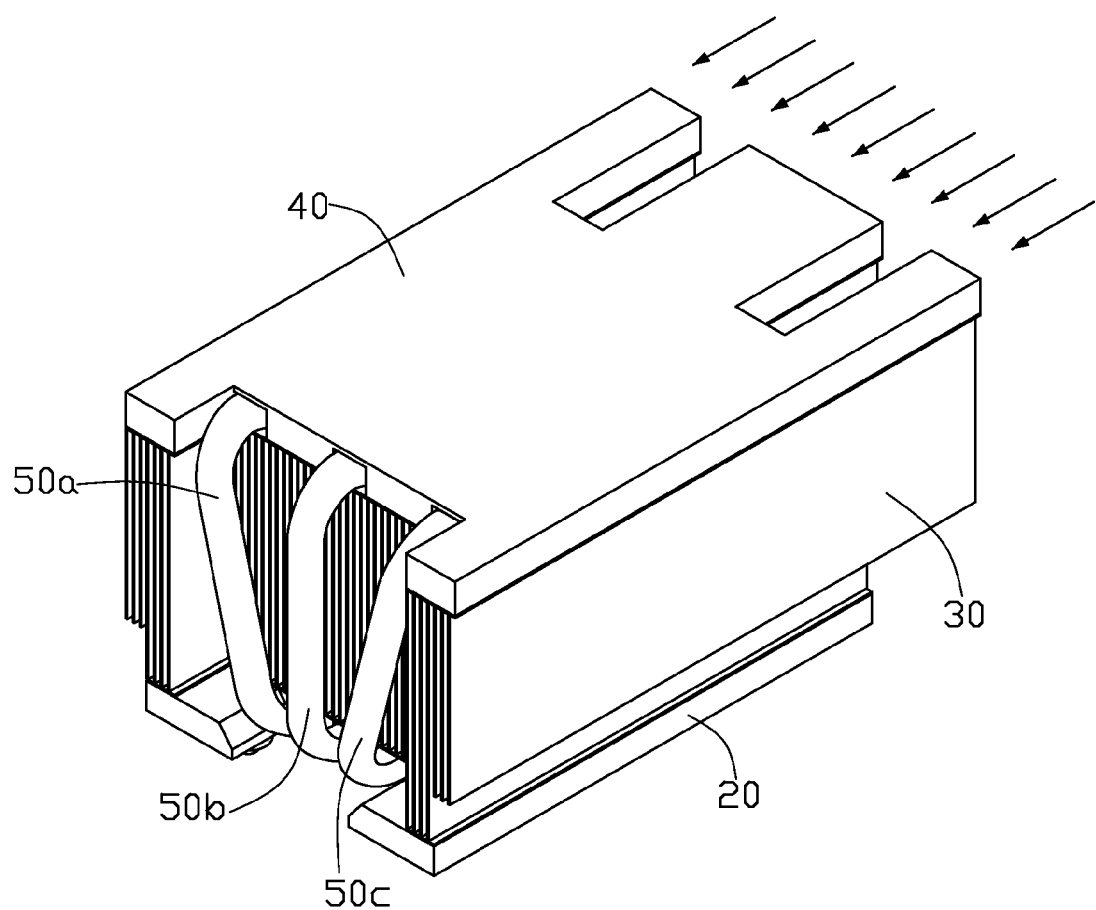
FIG. 1 is an assembled, isometric view of a heat dissipation device in accordance with a first preferred embodiment of the present invention.
Figure 2:
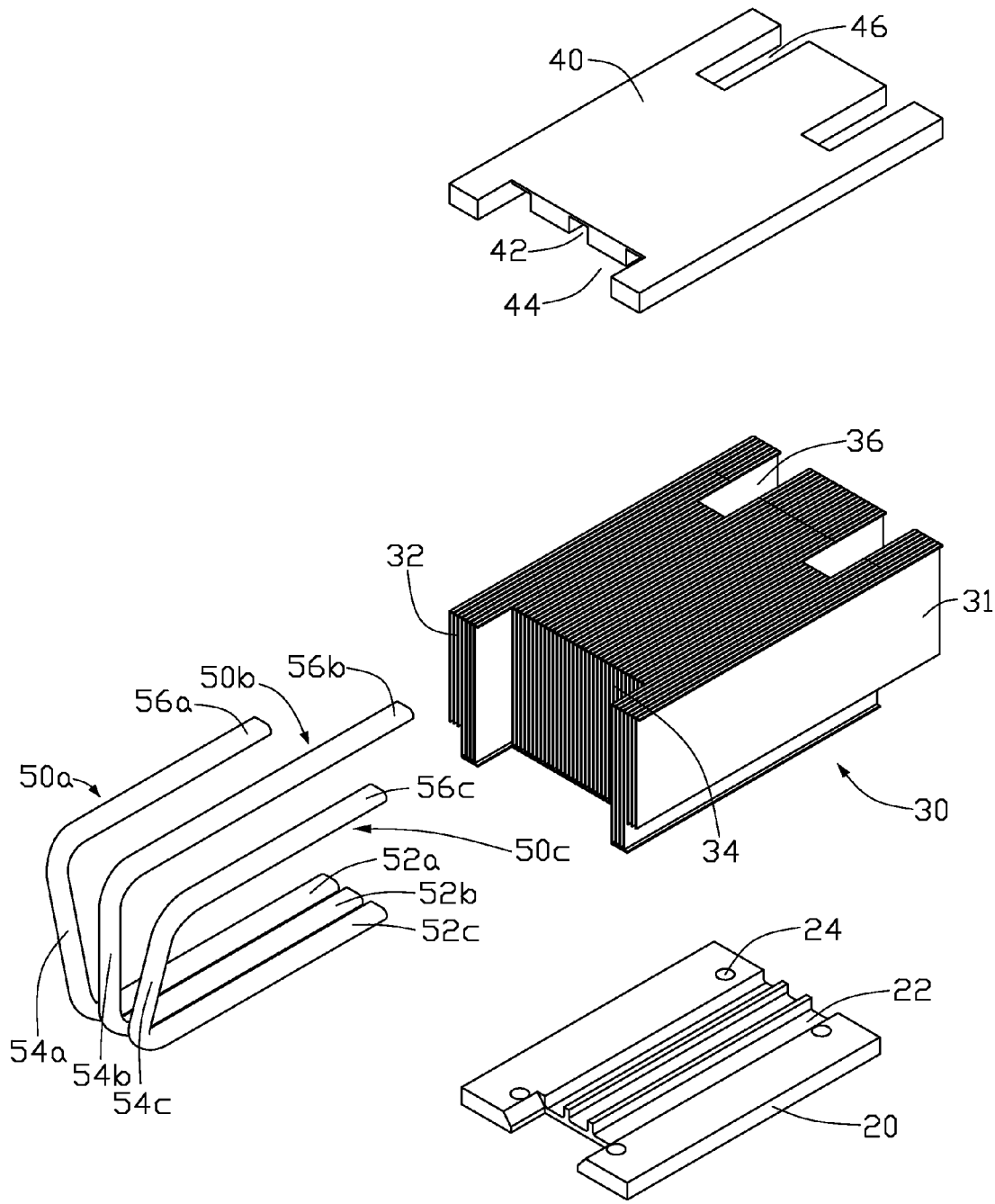
FIG. 2 is an exploded isometric view of the heat dissipation device in FIG. 1.

Referring to FIGS. 1 and 2, a heat dissipation device in accordance with a first preferred embodiment of the present invention is mounted on a printed circuit board (not shown) to remove heat from a heat-generating electronic device (not shown) such as a CPU mounted on the printed circuit board. The heat dissipation device comprises a base 20, a fin assembly 30 arranged on the base 20, a heat spreader 40 covering on the fin assembly 30, and three heat pipes 50a, 50b, 50c thermally connecting the base 20 and the heat spreader 40.

The base 20 is made of a material having high heat conductivity, such as copper or aluminum. The base 20 is substantially rectangular with four holes 24 defined vertically therethrough at four corners of the base 20. The holes 24 are used for a plurality of screws (not shown) extending therethrough to mount the base 20 on the printed circuit board. A bottom surface of the base 20 contacts with the heat-generating electronic device to absorb heat therefrom. Three parallel grooves 22 are defined at a top surface of the base 20 for receiving parts of the heat pipes 50a, 50b, 50c. The three grooves 22 are spaced close together, and extend longitudinally from a front side to a rear side of the base 20.

The fin assembly 30 is arranged on the base 20. The fin assembly 30 comprises a plurality of fins 31 parallel to each other. A channel 32 is formed longitudinally between every two adjacent fins 31 for allowing an airflow to flow therethrough in a direction shown as arrows in FIG. 1. The fins 30 at a center section of the fin assembly 30 are shorter than the fins 30 at two lateral sides of the fin assembly 30 to form a step configuration at a front and rear side of the fin assembly 30 respectively. A receiving space 34 is defined at the front side of the fin assembly 30 for positioning parts of the heat pipes 50a, 50b, 50c, and for providing passage of the screws to extend through the two holes 24 at the front side of the base 20. Two receiving spaces 36 are defined at the rear side of the fin assembly 30 corresponding to the position of the rest two holes 24 at the rear side of the base 20.

The heat spreader 40 covers on the fin assembly 30 and has an essentially identical configuration with a top surface of the fin assembly 30. Corresponding to the receiving spaces 34, 36 of the fin assembly 30, a cutout 44 is formed at a front side of the heat spreader 40, and two cutouts 46 are formed at a rear side of the heat spreader 40. Three parallel grooves 42 are defined at a bottom surface of the heat spreader 40 for receiving parts of the heat pipes 50a, 50b, 50c. The three grooves 42 extend longitudinally from the front side to the rear side of the heat spreader 40. The two cutouts 46 are communicated with the cutout 44 via two lateral grooves 42 respectively. A rest groove 42 is positioned in a center of the heat spreader 40 between the two lateral grooves 42, and is of larger length than the two lateral grooves 42. The heat spreader 40 is made of a material having high heat conductivity, such as copper or aluminum.

The three heat pipes 50a, 50b, 50c have essentially identical configurations, as well as having essentially identical functions. The heat pipes 50a and 50c are symmetrically slantwise arranged at two flanks of the heat pipe 50b. Each of the heat pipes 50a, 50b, 50c has a substantially U-shaped configuration. Each of the heat pipes 50a, 50b, 50c comprises a horizontal straight evaporating portion 52a, 52b, 52c and a horizontal straight condensing portion 56a, 56b, 56c parallel to the evaporating portion 52a, 52b, 52c, and a connecting portion 54a, 54b, 54c vertically connecting the evaporating portion 52a, 52b, 52c and the condensing portion 56a, 56b, 56c. The condensing portion 56b of the heat pipe 50b is of larger length than the condensing portions 56a, 56c of the rest two heat pipes 50a, 50c. The three evaporating portions 52a, 52b, 52c of the heat pipes 50a, 50b, 50c are spaced close together to be received in the three grooves 22 of the base 20. The connecting portions 54a, 54b, 54c of the heat pipes 50a, 50b, 50c are located in the front side of the fin assembly 30, specifically, in the receiving space 34 of the fin assembly 30. The condensing portions 56a, 56b, 56c of the heat pipes 50a, 50b, 50c are spaced a far distance than the evaporating portions 52a, 52b, 52c to be received in the grooves 42 of the heat spreader 40.

In assembly, firstly the evaporating portions 52a, 52b, 52c of the heat pipes 50a, 50b, 50c are received in the grooves 22 of the base 20. Secondly, the fin assembly 30 is arranged on the base 20. A bottom surface of the fin assembly 30 is thermally connected with a top surface of the base 20 by soldering. The evaporating portions 52a, 52b, 52c of the heat pipes 50a, 50b, 50c are sandwiched between the base 20 and the fin assembly 30. Thus, the evaporating portions 52a, 52b, 52c of the heat pipes 50a, 50b, 50c thermally contact with the base 20 and the fin assembly 30. The connecting portions 54a, 54b, 54c of the heat pipes 50a, 50b, 50c are positioned in the receiving space 34 of the fin assembly 30. The condensing portions 56a, 56b, 56c of the heat pipes 50a, 50b, 50c are thermally attached to a top surface of the fin assembly 30. The evaporating portions 52a, 52b, 52c and the condensing portions 56a, 56b, 56c are parallel to the fins 31 of the fin assembly 30. Thirdly, the heat spreader 40 covers on the fin assembly 30. The bottom surface of the heat spreader 40 is thermally connected with the top surface of the fin assembly 30 by soldering. The condensing portions 56a, 56b, 56c of the heat pipes 50a, 50b, 50c are received in the grooves 42 of the heat spreader 40, and sandwiched between the heat spreader 40 and the fin assembly 30. In this way the assembly of the heat dissipation device is completed. In the assembled heat dissipation device, the connecting portions 54a, 54b, 54c are located in the receiving space 34 of the front side of the fin assembly 30, the evaporating portions 52a, 52b, 52c are received in the grooves 22 of the base 20, and the condensing portions 56a, 56b, 56c are received in the grooves 42 of the heat spreader 40. In other words, the heat pipes 50a, 50b, 50c surround roughly half of the periphery of the fin assembly 30 in a route from the top to the front, and then to the bottom thereof.

In operation, heat produced by the electronic device is firstly absorbed by the base 20, then a part of heat of the base 20 is directly conducted to the fin assembly 30, and then dissipated to atmosphere, advantageously via the airflow to flow through the channels 32 of the fin assembly 30. Another part of the heat of the base 20 is conducted to the evaporating portions 52a, 52b, 52c of the heat pipes 50a, 50b, 50c. Then, the heat absorbed by the evaporating portions 52 is transferred upwardly to the condensing portions 56a, 56b, 56c along the connecting portions 54a, 54b, 54c. As the condensing portions 56a, 56b, 56c thermally contact with the heat spreader 40 and the fin assembly 30, the heat absorbed by the heat pipes 50a, 50b, 50c can be quickly conducted to the heat spreader 40 and the fin assembly 30 via the condensing portions 56a, 56b, 56c. No parts of the heat pipes 50a, 50b, 50c insert into the fins 31 of the fin assembly 30, that is, the heat pipes 50a, 50b, 50c are positioned in an external space of the channels 32. Thus, the airflow can flow through the channels 32 with no impediments, to dissipate heat from the fins 31 to atmosphere timely, and the efficiency of the heat dissipation device is improved. Furthermore, in respect of the configuration of the receiving space 34 which the connecting portions 54a, 54b, 54c are located therein, the volume of the heat dissipation device is decreased.

Figure 3:
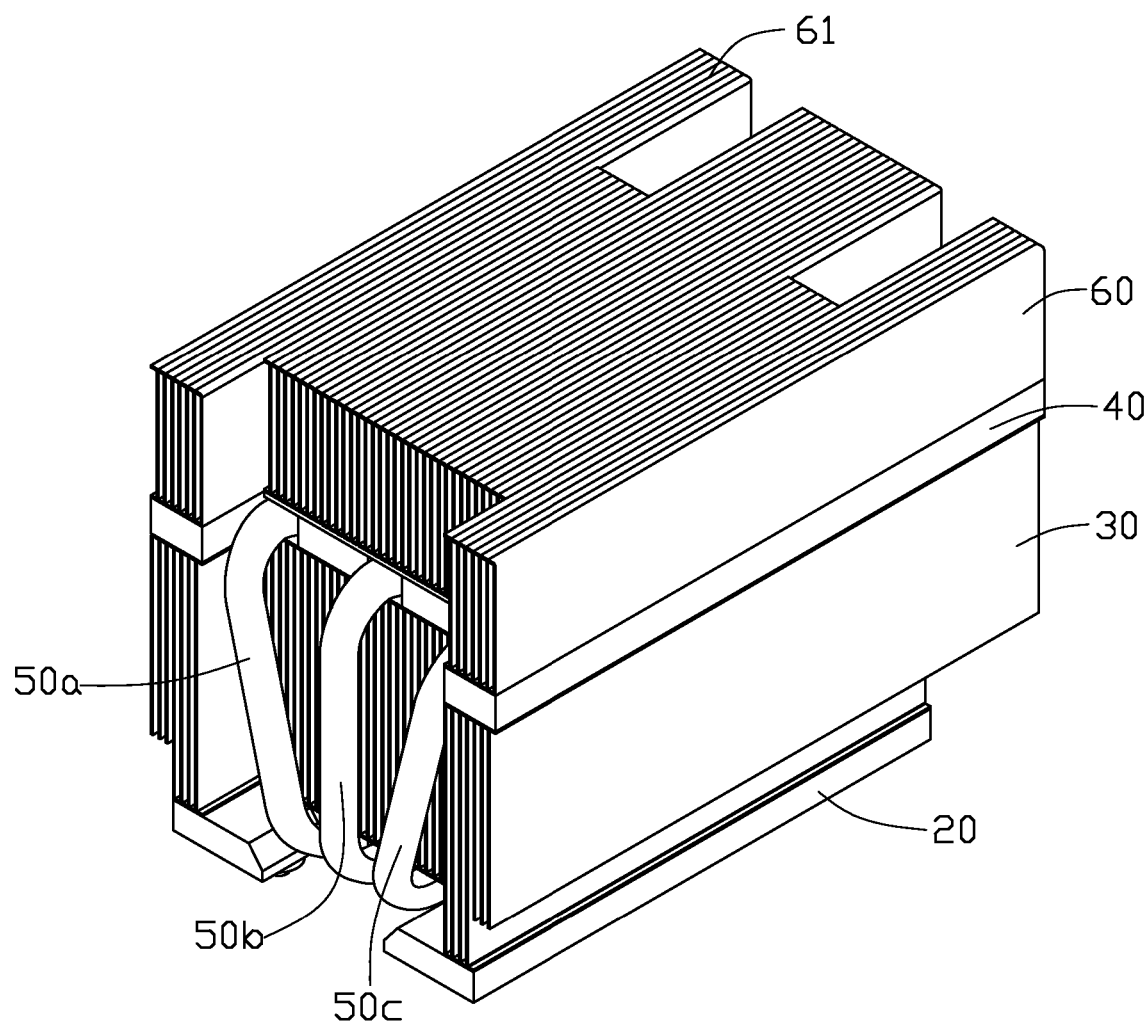
FIG. 3 is an assembled, isometric view of a heat dissipation device in accordance with a second embodiment of the present invention.

FIG. 3 shows a second embodiment of a heat dissipation device according to the present invention. Compared with the first embodiment, the heat dissipation device further comprises an additional fin assembly 60 arranged on the heat spreader 40. A configuration of a bottom surface of the additional fin assembly 60 is identical to that of a top surface of the heat spreader 40. The additional fin assembly 60 also comprises a plurality of fins 61 having an essentially identical structure and configuration with that of the fin assembly 30. Therefore, a detailed description of the additional fin assembly 60 is omitted here. The bottom surface of the additional fin assembly 60 is thermally connected with the top surface of the heat spreader 40 by soldering. The heat absorbed by the heat pipes 50a, 50b, 50c could be further conducted to the additional fin assembly 60 via the heat spreader 40, and then dissipated to atmosphere. Thus, by the provision of the additional fin assembly 60, a heat dissipation area of the heat dissipation device is enlarged and the efficiency of the heat dissipation device is improved. Understandably, the additional fin assembly 60 and the heat spreader 40 can be formed integrally, and the fins 61 of the additional fin assembly 60 integrally extend upwardly from the top surface of the heat spreader 40.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device adapted for removing heat from a heat generating electronic device, the heat dissipation device comprising:

a base adapted for absorbing heat from the electronic device;

a heat spreader located above the base;

a first fin assembly comprising a plurality of fins arranged between the base and the heat spreader, with a channel defined between every two adjacent fins, each of the fins extending along a front-to-rear direction, and the channel extending along the front-to-rear direction;

a heat pipe thermally contacting the base and the heat spreader, the heat pipe comprising an evaporating portion thermally contacting the base, a condensing portion thermally contacting the heat spreader, and a connecting portion interconnecting the evaporating portion and the condensing portion, the evaporating portion and condensing portion being parallel to the fins, and the connecting portion located at a rear side of the first fin assembly; and two additional heat pipes being symmetrically slantwise arranged at flanks of the heat pipe;

wherein the condensing portion of the heat pipe is of larger length than that of the two additional heat pipes.

2. The heat dissipation device as claimed in claim 1, wherein the base defines a groove receiving the evaporating portion of the heat pipe therein and the heat spreader defines a groove receiving the condensing portion of the heat pipe therein.

3. The heat dissipation device as claimed in claim 1, wherein the evaporating portion of the heat pipe is sandwiched between the base and the first fin assembly, and the condensing portion of the heat pipe is sandwiched between the first fin assembly and the heat spreader.

4. The heat dissipation device as claimed in claim 1, wherein lengths of fins at two lateral sides of the first fin assembly are larger than those of fins at a center section of the first fin assembly to define a receiving space for positioning the connecting portion of the heat pipe.

5. The heat dissipation device as claimed in claim 1, wherein a bottom surface of the first fin assembly is thermally connected to a top surface of the base by soldering, and a top surface of the first fin assembly is thermally connected to a bottom surface of the heat spreader by soldering.

6. The heat dissipation device as claimed in claim 1, further comprising a second fin assembly arranged on the heat spreader.

7. The heat dissipation device as claimed in claim 6, wherein a bottom surface of the second fin assembly is thermally connected to a top surface of the heat spreader by soldering.

8. A heat dissipation device, comprising:
a base;
a heat spreader located above the base;
a plurality of parallel fins sandwiched between the base and the heat spreader, channels formed between the fins, the fins having a first portion and second portions located at two flanks of the first portion, the second portions being longer than the first portion in a manner such that a receiving space is defined between the second portions;
a heat pipe having an evaporating portion sandwiched between the base and a bottom of the first portion of the fins, a condensing portion sandwiched between the heat spreader and a top of the first portion of the fins, and a connecting portion interconnecting the evaporating and condensing portions and received in the receiving space; and
two additional heat pipes being symmetrically slantwise arranged at flanks of the heat pipe;
wherein the condensing portion of the heat pipe is of larger length than that of the two additional heat pipes.

9. The heat dissipation device as claimed in claim 8, wherein an extending direction of the evaporating and condensing portions is the same as that of the channels of the fins.

* * * * *